April 1, 1969 R. N. CLAYTOR ET AL 3,436,666

SOLID STATE TRAVELING WAVE AMPLIFIER

Filed June 5, 1967

INVENTORS

RICHARD N. CLAYTOR
FRANK E. EMERY

E. Mickey Hubbard
ATTORNEY

United States Patent Office 3,436,666
Patented Apr. 1, 1969

3,436,666

SOLID STATE TRAVELING WAVE AMPLIFIER

Richard N. Claytor, Dallas, and Frank E. Emery, Richardson, Tex., assignors to Texas Instruments Incorporated, Dallas, Tex., a corporation of Delaware Filed June 5, 1967, Ser. No. 643,455
Int. Cl. H01s *4/00;* H03f *3/04*
U.S. Cl. 330—5 8 Claims

ABSTRACT OF THE DISCLOSURE

A traveling wave amplifier in which a beam of carriers is constrained within a narrow channel in a semiconductor substrate and a slow wave structure formed by a meandering microstrip transmission line formed on the surface of the semiconductor overlying channel.

Figure 1:
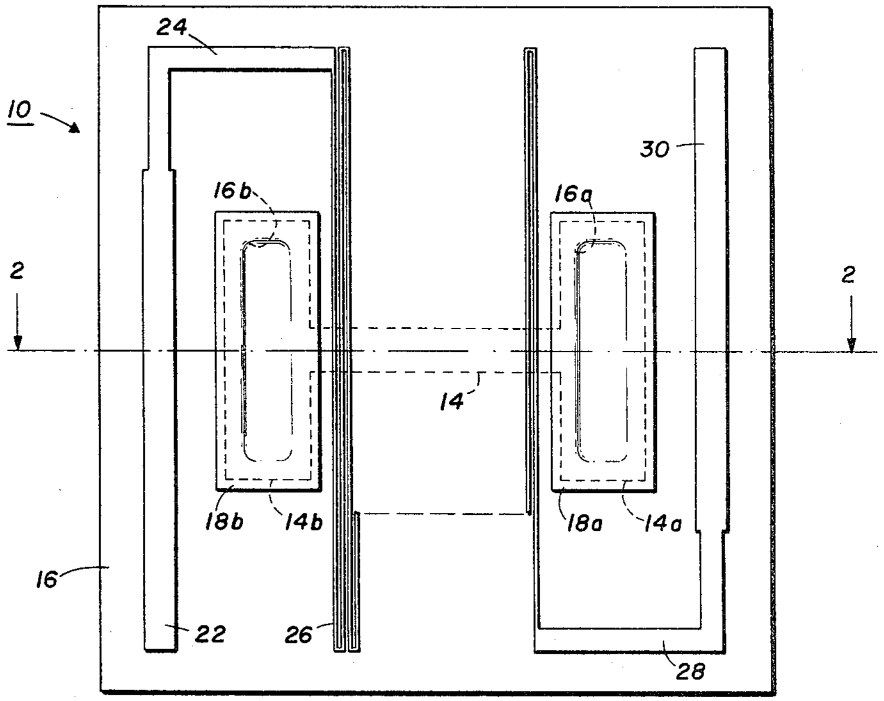

This invention relates generally to the amplification of electromagnetic energy at microwave frequencies, and more particularly relates to traveling wave amplifiers.

In general, solid state semiconductor devices are more compact, less expensive due to a simple mass production processing, more rugged, and have a longer service life than most mechanical electronic structures such as tubes, wave guides and the like used to accomplish the same electronic function. However, solid state microwave amplification has been primarily limited to parametric amplifiers, transistor amplifiers, tunnel diode amplifiers, solid state masers, and acoustic amplifiers. Solid state parametric amplifiers are complex and inefficient since they require a relatively high power microwave source for pumping. Tunnel diode amplifiers tend to be unstable and are not capable of high gain or high power operation. Transistor amplifiers have fairly high efficiencies and have power outputs on the order of a watt in the low microwave region, but suffer from considerable complexity and low gain at high power levels and high frequencies. Masers are complex, have low output powers, and must be operated in a cryogenic environment. Acoustic amplifiers have proven to be unstable, noisy, inefficient, and incapable of high power operation.

Thermionic traveling wave amplifiers are commonplace. They utilize the interaction between electromagnetic energy traveling on a slow wave structure such as, for example, a loaded wave guide, helix, comb, or series of coupled capacitors and a beam of electrons traveling at about one-tenth the speed of light in proximity with the slow wave structure. When the speed of the electrons exceeds the phase velocity of the electromagnetic energy in the slow wave structure, energy can be extracted from the beam of electrons by the action of the electromagnetic field, thus resulting in amplification of the electromagneic energy in the slow wave structure. These devices are stable, have large gains, good noise figures and high power outputs, but are large, heavy, and require a magnetic field to confine and focus the beam of electrons.

In accordance with this invention, a solid state traveling wave amplifier for microwave energy is formed by a narrow channel of one conductivity type in a thin slice of high resistivity semiconductor material of the other conductivity type such that the combinaion of the p-n junction and the high resistivity of the substrate contribute to confining the flow of carriers to the channel. A slow wave structure is provided by a meandering microstrip transmission line on the surface of the semiconductor disposed with the reaches of the meandering line overlying the diffused channel. The structure has the advantages of a conventional traveling wave amplifier plus the advantages of a solid state device.

Figure 2:
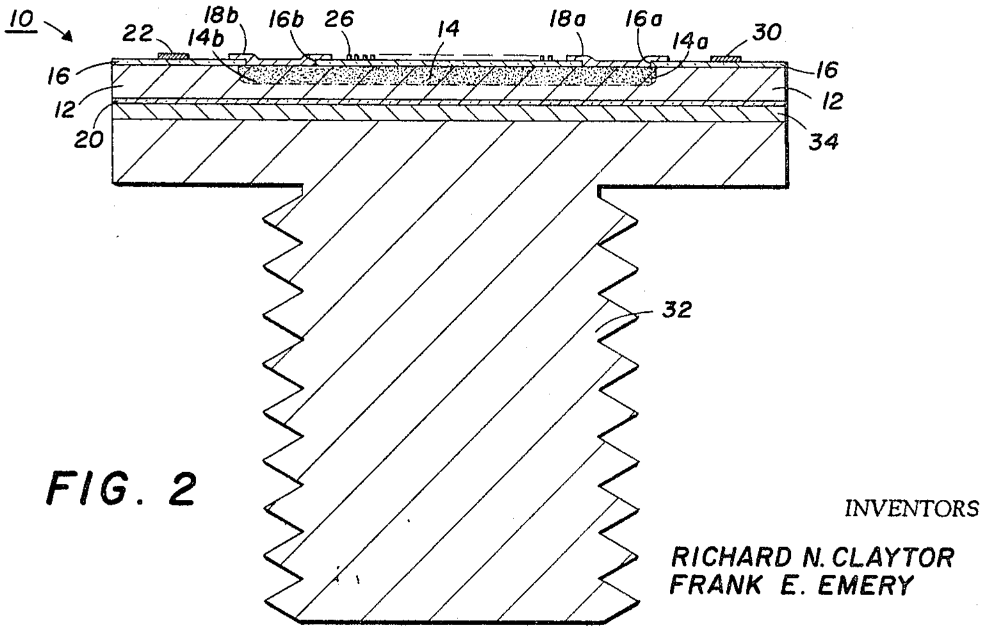

The novel features believed characteristic of this invention are set forth in the appended claims. The invention itself, however, as well as the objects and advantages thereof, may best be understood by reference to the following detailed description of an illustrative embodiment, when read in conjunction with the accompanying drawing, in which:

FIGURE 1 is a plan view of a device constructed in accordance with the present invention in which the vertical dimension has been greatly reduced for purposes of illustration; and FIGURE 2 is a sectional view taken substantially on lines 2—2 of FIGURE 1 in which the veritical dimension of the upper portion of the drawing has been substantially expanded for purposes of illustration.

Referring now to the drawing, a traveling wave amplifier constructed in accordance with the present invention is indicated generally by the reference numeral 10. The traveling wave amplifier 10 is comprised of a thin slice 12 of a high resistivity, monocrystalline semiconductor material, such as silicon, gallium arsenide or indium antinomide, in which the mean drift velocity of the carriers is sufficiently high. Silicon is particularly suited for this purpose, and the slice 12 is preferably high resistivity p-type silicon. A very shallow, narrow, low resistivity, n-type diffused channel 14 lies at the surface of the semiconductor slice 12 and has enlarged contact regions **14*a* and 14*b* at the opposite ends of the channel 14 to facilitate making electrical contact with the channel. The channel 14 may be formed by an epitaxial process or any other suitable conventional process. A very thin layer 16 of insulating material, such as silicon diode, overlies the surface of the semiconductor slice 12 and has contact openings 16*a* and 16*b*. Thin metal contacts 18*a* and 18*b* extend through the openings 16*a* and 16*b*, respectively, and are in ohmic contact with the diffused contact regions 14*a* and 14*b*, respectively. A continuous metal strip conductor is formed on the surface of the insulating layer 16 and in conjunction with a metallized ground plane 20 on the back surface of the substrate 12, and the dielectric properties of the insulating layer 16 and semiconductor body 12 form a microstrip transmission line. The transmission line has a standard fifty ohm input section 22, an input impedance transforming section 24, a meandering slow wave section 26, an output impedance transforming section 28, and a standard fifty ohm output section 30. The semiconductor slice 12 is mounted on a threaded copper stud 32 by a layer 34 for matching the thermal expansion. The stud 32** is threaded into a grounded heat sink.

In general, the device 10 is operated by connecting the input 22 to a source of microwave energy having a fifty ohm output impedance and the output 30 is connected to a circuit for receiving the amplified signal which has a fifty ohm input impedance. A D.C. voltage is impressed across contacts **18*a* and 18*b*, with contact 18*a* positive. This potential difference established across the channel region with respect to the slice 12 also reverse biases the p-n junction defining the channel 14 and in conjunction with the high resistivity of the slice 12 confines the flow of carriers, in this instance electrons, to the channel 14.** When the applied voltage is such that the drift velocity of the carriers in the channel approximates the apparent velocity of the phase of the microwave energy in the direction of the channel, the electromagnetic coupling between the two results in the transfer of energy to the microwave signal and amplification of the microwave energy.

Although precise equations for the design of the device 10 have not been derived, a useful equation for the gain of the traveling wave amplifier is:

$$\text{Gain (db)} = -9.54 + 47.3CN \qquad (1)$$

where N is the length of the slow wave structure in wavelengths, and:

$$C^3=\frac{\alpha^2}{8}\frac{v_p}{v_g}\frac{v_0}{C}\sqrt{\frac{\mu}{\epsilon}}\frac{I_0}{V_0} \qquad (2)$$

where $v_p/v_g$ is the ratio of the phase velocity to the group velocity of the slow wave structure;

$v_0/C$ is the ratio of the velocity of the electrons in the channel to the velocity of propagation of the electromagnetic waves in silicon;

$$\sqrt{\frac{\mu}{\epsilon}}$$

is the impedance of the silicon, and is about 100 ohms;

$I_0/V_0$ is the ratio of the electron current in the channel to the voltage applied between the ends of the channel;

$\alpha$ is a constant of the structure measuring the coupling between the beam of carriers through the channel and the electromagnetic waves on the slow wave structure.

Since approximately one-third of the total electric field or the slow wave structure acts on the electrons, $\alpha$ is about 0.33. An electron velocity $v_0$ of $5.1\times10^6$ cm./sec. requires an electric field of 5,000 volts/cm. in n-type silicon at 298° K. If the length of the channel is 1 mm., $V_0$ is 500 volts, a practical value. The velocity of electromagnetic waves C is about $1\times10^{10}$ cm./sec. in silicon. The ratio $v_0/C$ for this example is thus $5.1\times10^4$.

A temperature rise of 25° C. above room temperature in the silicon will not drastically lower the velocity of the electrons at the applied field of 5,000 volts/cm. Junction temperature rises of 0.5° C. per watt are typical in power transistor structures, making a power dissipation of 50 watts practical. This power level corresponds to a current I of 100 ma. These current and voltage levels require a channel depth of 0.05 mil ($1.28\times10^{-3}$ mm.), a width of 15 mils (0.385 mm.) and a length of 1 mm. The channel should be doped n-type to a carrier concentration of $10^{16}$ carriers/cm.$^3$.

The slow wave structure may consist of a meandered strip line of silver deposited on a layer of silicon oxide 20,000 angstrom units thick in turn deposited on a 10 mil (0.254 mm.) slab of silicon. The dielectric layer of silicon oxide must be placed between the meandered metal strip and the silicon to avoid short circuiting the voltage $V_0$. In order to match the velocity of the electrons in the silicon, the slow wave structure must exhibit a velocity of $5.1\times10^6$ cm./sec. In order to guarantee a strong electric field in the center of the structure, each long segment of the line should be one wavelength long, or approximately one centimeter for a frequency of 10 gHz. Assuming no cross-coupling in the meander line, and neglecting the effect of the stream of electrons on the velocity of electromagnetic waves in the meander line, the total space which can be allotted to the width of the strip conductor and the spacing between adjacent strips is given by:

$$\lambda\times5.1\times10^{-4}\text{ cm.}=0.2\text{ mil}$$

Present photomasking and etching technology limits the size of practical lines and spacings to about 0.1 mil each. The meander line can therefore consist of a strip 0.1 mil ($2.54\times10^{-3}$ mm.) in width folded back parallel to itself to form reaches 1.0 cm. long with adjacent reaches spaced apart a distance of 0.1 mil ($2.54\times10^{-3}$ mm.). A line one millimeter long thus has a physical length of 195 cm. and an electrical length of 195 wavelengths.

Although the value of $v_p/v_g$, the ratio of phase to group velocity on the meander line, may be made indefinitely large in high Q resonant structures, a value of ten is a more reasonable figure for a small meander line on silicon. The constant C has the value of $1.6\times10^{-2}$.

Assuming the above values, the gain calculated by means of Equations 1 and 2 is 151.1 db. The impedance of the microstip transmission line forming the slow wave structure is about 100 ohms, thus necessitating transforming segments 24 and 28 at the input and output ends of the device to provide compatibility with standard fifty ohm coaxial microwave equipment.

Energy losses will occur in the meandered strip line. The primary loss will be the conductor loss due to the resistance of the metal strip line. The width of the line is 0.1 mil or $2.54\times10^{-4}$ cm., and the length is 195 cm. If the thickness of the strip conductor is made equal to the skin depth at 10 gHz., $6.5\times10^{-5}$ cm. for silver, and the line impedance is 100 ohms, the attenuation due to conductor losses is 71 db. Some additional loss will result from dissipation in the silicon dielectric, but the device is arranged so that interaction with the conduction electrons in the channel produces a gain rather than a loss. The line external to the channel contributes an additional 19.5 db dielectric loss, based on a loss of 0.1 db/cm. for strip line on $10^4$ ohm-cm. resistivity silicon. The total loss expected in the slow wave structure is thus 90.5 db.

Under the above set of simplifying assumptions, therefore, the net gain of the device is calculated to be 61.0 db. In addition, the effects of the following interactions should be considered. The interaction between segments of the meander line increase the slow wave velocity on the line. Radiation from the slow wave structure decreases the net gain of the device. The presence of the electron stream has some effect on the impedance of the slow wave structure. There is also some decrease in gain due to the effects of space charge and hole conduction on the gain mechanism. These are higher order effects, however, and can best be compensated by empirical data.

Although a preferred embodiment of the invention has been described in detail, it is to be understood that various changes, substitutions, and alterations can be made therein without departing from the spirit and scope of the invention as defined by the appended claims.

What is claimed is:

1. A traveling wave amplifier comprising a high resistivity semiconductor substrate of a first conductivity type, a relatively narrow channel region of an opposite conductivity type adjacent one surface of said semiconductor substrate, means disposed adjacent said one surface for applying a predetermined voltage across said channel to provide a flow of charge carriers through said channel, said charge carriers being substantially confined to said channel, and a substantially continuous strip conductor adapted to transmit a microwave signal overlying said one surface of said substrate and electrically insulated from said channel region, said strip conductor being electromagnetically coupled to said charge carriers, said electromagnetic coupling effecting a transfer of energy between the charge carriers and the microwave signal when the drift velocity of the charge carriers approximates the apparent phase velocity of the microwave signal in the direction of the channel region.

2. A traveling wave amplifier according to claim 1 wherein said channel cooperates with said semiconductor substrate to define a p-n junction terminating at said one surface of said substrate, and said means for applying said predetermined voltage across said channel includes a pair of ohmic contacts disposed at opposite ends of said channel region to establish a potential difference thereacross and reverse bias said p-n junction, thereby substantially confining said flow of charge carriers to said channel.

3. A traveling wave amplifier according to claim 2 wherein said strip conductor is disposed intermediate said ohmic contacts and comprises a meandering strip line having a plurality of closely spaced parallel segments of a predetermined length each extending transversely of said channel.

4. A traveling wave amplifier according to claim 3 wherein a metallized ground plane is disposed adjacent a surface of said semiconductor substrate opposite to said one surface and cooperates with said semiconductor substrate and said meandering strip line to define a microstrip transmission line.

5. A traveling wave amplifier according to claim 3 wherein each of said segments is of a length substantially equal to the wavelength of the transmitted microwave signal.

6. A traveling wave amplifier according to claim 3 wherein said semiconductor substrate comprises p-type silicon and said channel region comprises an n-type diffused region having enlarged contact regions at opposite ends thereof for accommodating said ohmic contacts.

7. A traveling wave amplifier comprising a high resistivity semiconductor body of one conductivity type, a relatively narrow channel region of opposite conductivity type formed at one major face of said semiconductor body, said channel region having enlarged contact regions at opposite ends thereof, a layer of insulating material overlying said one major surface of said semiconductor body, said layer of insulating material having openings therein exposing said enlarged contact regions, means coupled to said enlarged contact regions for effecting a flow of charge carriers between opposite ends of said channel region, a microstrip transmission line adapted to transmit microwave signals including a conductive strip line disposed adjacent said channel region and separated therefrom by said layer of insulating material, said conductive strip line being electromagnetically coupled to said channel region, said electromagnetic coupling affecting a transfer of energy between charge carriers flowing through said channel region and the transmitted microwave signal when the velocity of the charge carriers approximates the apparent phase velocity of the microwave signal, thereby amplifying the microwave signal.

8. A traveling wave amplifier according to claim 7 wherein, said conductive strip line comprises a substantially continuous meandering conductor having a plurality of parallel reaches disposed generally normal to said channel region and wherein a metallized ground plane is disposed at an opposing major face of said semiconductor body and cooperates with said semiconductor body, said insulating layer and said conductive strip line to define said microstrip transmission line.

References Cited

UNITED STATES PATENTS

| | | | |
|---|---|---|---|
| 2,760,013 | 8/1956 | Peter | 330—5 |
| 3,008,089 | 11/1961 | Uhlir | 330—4.6 |
| 3,092,782 | 6/1963 | Chang | 330—4.6 |
| 3,173,102 | 3/1965 | Loewenstern | 330—5 |
| 3,200,354 | 8/1965 | White | 330—5.5 |
| 3,270,241 | 8/1966 | Vural | 330—5 |

ROY LAKE, *Primary Examiner.*

D. R. HOSTETTER, *Assistant Examiner.*

U.S. Cl. X.R.

330—53, 34